United States Patent
Belikov et al.

(10) Patent No.: US 7,042,920 B2
(45) Date of Patent: May 9, 2006

(54) PHASED ARRAY GRATINGS AND TUNABLE LASERS USING SAME

(75) Inventors: Ruslan Belikov, Stanford, CA (US); Olav Solgaard, Stanford, CA (US)

(73) Assignee: Board of Trustees of the Leland Stanford Junior University, Palo Alto, CA (US)

( * ) Notice: Subject to any disclaimer, the term of this patent is extended or adjusted under 35 U.S.C. 154(b) by 272 days.

(21) Appl. No.: 10/384,180

(22) Filed: Mar. 6, 2003

(65) Prior Publication Data

US 2003/0231692 A1    Dec. 18, 2003

Related U.S. Application Data

(60) Provisional application No. 60/362,514, filed on Mar. 6, 2002.

(51) Int. Cl.
H01S 3/08    (2006.01)

(52) U.S. Cl. ............................. 372/92; 372/99; 372/102

(58) Field of Classification Search ................. 372/92, 372/61, 99; 310/309; 331/94.5; 359/571
See application file for complete search history.

(56) References Cited

U.S. PATENT DOCUMENTS

| | | | | |
|---|---|---|---|---|
| 3,790,898 A * | 2/1974 | Gudmundsen et al. | ........ | 372/20 |
| 5,311,360 A | 5/1994 | Bloom et al. | ................ | 359/372 |
| 5,757,536 A | 5/1998 | Ricco et al. | ................ | 359/224 |
| 5,905,571 A | 5/1999 | Butler et al. | ................ | 356/328 |
| 5,938,308 A * | 8/1999 | Feldman et al. | ............... | 353/42 |
| 6,282,213 B1 * | 8/2001 | Gutin et al. | .................. | 372/20 |
| 6,445,502 B1 * | 9/2002 | Islam et al. | ................. | 359/571 |
| 2002/0018496 A1 | 2/2002 | Gutin | .......................... | 372/20 |
| 2002/0105725 A1 | 8/2002 | Sweatt et al. | ............... | 359/566 |
| 2002/0167245 A1 * | 11/2002 | Hung et al. | ................. | 310/309 |
| 2002/0167695 A1 | 11/2002 | Senturia | ..................... | 359/130 |
| 2002/0176469 A1 * | 11/2002 | Volger et al. | ................. | 372/61 |
| 2002/0191913 A1 | 12/2002 | Hocker et al. | ................ | 385/37 |
| 2003/0007522 A1 | 1/2003 | Li et al. | ....................... | 372/20 |

* cited by examiner

Primary Examiner—Minsun Oh Harvey
Assistant Examiner—Dung (Michael) T. Nguyen
(74) Attorney, Agent, or Firm—DeMont & Breyer LLC

(57) ABSTRACT

A tunable laser comprises multiple reflectors defining a resonant cavity, and an optical gain medium positioned within the resonant cavity. One of the reflectors is a programmable micromirror array that acts as a tunable blazed diffraction grating providing continuous tuning of a single resonant mode over a wavelength gain region of the gain medium. The continuous tuning is provided by altering the micromirror array to shift, in synchrony, a resonant mode wavelength of the resonant cavity and a reflection filtering peak of the array. The array comprises a plurality of micromirror elements that can be controlled to independently move in a direction perpendicular to the plane of the array. In one embodiment, each element has a V-shaped movable mirror. In another embodiment, each element has a flat or slightly-tilted horizontal mirror and a vertical or nearly-vertical mirror orthogonal to the horizontal mirror producing a corner-cube-like reflection.

7 Claims, 6 Drawing Sheets

PHASED ARRAY GRATINGS AND TUNABLE LASERS USING SAME

CROSS-REFERENCE TO RELATED APPLICATIONS

This application claims priority from U.S. provisional patent application 60/362,514 filed Mar. 6, 2002, which is incorporated herein by reference.

STATEMENT REGARDING FEDERALLY SPONSORED RESEARCH OR DEVELOPMENT

This invention was supported by DARPA contract F49620-00-C-0040 awarded by the US Air Force. The US Government has certain rights in the invention.

FIELD OF THE INVENTION

The present invention relates generally to micromirror arrays and their use in tunable laser systems. More specifically, the invention relates to programmable phased micromirror arrays and the use of such arrays to provide continuous tuning of external cavity lasers.

BACKGROUND OF THE INVENTION

A laser produces light with a wavelength that is determined primarily by the characteristics of the laser's gain medium and the discrete set of resonant modes supported by the laser's optical cavity. A single-mode laser is designed to support just one of the resonant modes of the optical cavity, producing light with a very narrow and well-defined wavelength. Tunable lasers allow the wavelength of the generated light to be controllably tuned over a range of wavelengths. When a single-mode laser is tuned, the wavelength of the laser can discontinuously jump from one resonant mode to the next-an undesired effect called mode hopping. Continuously tunable, single-mode lasers have great value in many current and anticipated technological applications including, for example, wavelength division multiplexed (WDM) fiber optic communication. Creating such lasers, however, has not been without its challenges.

According to a traditional method for tuning a laser, a diffraction grating is used as one of the cavity mirrors of an external cavity laser (ECL). The grating functions as a narrow-bandwidth reflector that tunes the laser output wavelength by controlling the precise position and orientation of the grating. Because mechanical movement of the entire grating is required, the laser cannot tune quickly. It is also sensitive to optical misalignments. Another approach uses a fixed grating to disperse light wavelengths across the surface of a micromirror array. Micromirrors positioned where the desired wavelength illuminates the array are controlled to reflect light back to the grating, while all other mirrors are controlled to deflect light away. Although this approach does not require large mechanical movements for wavelength tuning, it is also sensitive to misalignments. Moreover, it does not tune continuously.

An alternative tunable laser technology is the tunable vertical cavity surface emitting laser (VCSEL). The fabrication technology of the VCSEL, however, limits the power and quality of the output beam. There are various other methods of tuning lasers, including distributed feedback, sampled grating, and distributed Bragg reflector, each one with its own advantages and disadvantages, as illustrated in Table 1.

TABLE 1

Advantages and disadvantages of various tunable laser designs

| Technology | Advantages | Disadvantages |
| --- | --- | --- |
| Classical tunable ECL | wide tuning range, and high power | thermal and mech. instability, slow tuning, and large size |
| Tunable VCSEL | small size, simple packaging (inexpensive), wide tuning range, and fast tuning | low power, optical pumping, poor quality optics at 1.5 µm, and poor output quality |
| Others | simple/reliable structure, and/or wide tuning range | complex/unreliable structure, low tuning range, and/or mode hopping |

There is thus a need for a laser that is compact and mechanically robust, outputs high power, provides single-mode operation, and is quickly tunable over a wide tuning range without mode hopping.

SUMMARY OF THE INVENTION

The present invention provides continuously tunable external cavity lasers and novel micromirror arrays that can be programmed to provide the functionality of tunable blazed diffraction gratings for such lasers. The arrays may be fabricated as a microelectromechanical systems (MEMS) phased array, and may also be useful for other optical applications such as spectroscopy, optical multiplexing, and optical switching.

In one aspect of the invention, a tunable laser is provided comprising multiple reflectors forming a resonant cavity, and an optical gain medium positioned within the resonant cavity. One of the reflectors is a programmable micromirror array that has a fixed distance and orientation relative to the other reflectors of the resonant cavity. The resonant cavity may be implemented in a Littrow configuration, Littman configuration, or other conventional configuration. The array acts as a tunable blazed diffraction grating providing continuous tuning of a single resonant mode over a wavelength gain region of the gain medium. The continuous tuning is provided by altering the micromirror array to shift, in synchrony, a resonant mode wavelength of the resonant cavity and a reflection filtering peak of the array. In one embodiment, the array comprises a plurality of micromirror elements, where each micromirror element has a tilted mirror and a movable mirror. The tilted mirror has a reflective surface orientation fixed at a non-zero angle with respect to the substrate surface, while the movable mirror has a reflective surface position movable in a direction perpendicular to the substrate surface in response to an electrical control signal. In some cases, the tilted mirror may be movable, and the movable mirror may be tilted, so that two tilted mirrors move together. In other cases, the tilted mirror is fixed (preferably near a 90 degree angle), and the movable mirror is substantially parallel to a plane of the array. The laser may include circuitry to control the array to act as a tunable blazed diffraction grating. In one embodiment, the circuitry controls micromirror elements such that, for a desired tuning wavelength, effective transverse blaze grating element displacements of adjacent elements, modulo half of the desired tuning wavelength, differ by a constant. The circuitry may control the array to act, in addition, as a collimating lens.

In another aspect of the invention, a method is provided for tuning a laser. The method comprises providing a programmable micromirror array as one of the reflectors defining a resonant cavity of the laser, where the array position and orientation are fixed relative to the cavity. The micromirror elements of the array are controlled such that the array effectively functions as a tunable blazed diffraction grating continuously tuning a single resonant mode over a wavelength gain region of the gain medium. In one embodiment, the micromirror elements are controlled to alter their displacements to shift, in synchrony, a resonant mode wavelength of the resonant cavity and a reflection filtering peak of the array. In some embodiments, the micromirrors are controlled to move in directions perpendicular to a surface of the array such that, for a desired tuning wavelength, the micromirror elements produce effective transverse blaze grating element displacements of adjacent elements differ, modulo half of the desired tuning wavelength, by a constant. The micromirror elements may be controlled such that the array also acts as a collimating lens.

In another aspect of the invention, a programmable micromirror array is provided. The array includes a plurality of micromirror elements periodically positioned on a substrate surface. Each micromirror element has a tilted mirror and a movable mirror, where the tilted mirror has a reflective surface orientation fixed at a non-zero angle with respect to the substrate surface, and the movable mirror has a reflective surface position movable in a direction perpendicular to the substrate surface in response to an electrical control signal. In one embodiment, the movable mirror is tilted with respect to the substrate surface, and the tilted mirror is movable in a direction perpendicular to the substrate surface and moves together with the movable mirror. In another embodiment, the tilted mirror is fixed (preferably nearly orthogonally) with respect to the substrate surface, while the movable mirror may be slightly tilted at a fixed angle, or not tilted at all (i.e., parallel) with respect to the substrate surface. The reflective surface orientation of the tilted mirror in this embodiment preferably has an orientation of 90 degrees with respect to the movable mirror. In some embodiments, the array further comprises circuitry to control the array to act as a tunable blazed diffraction grating. For example, the circuitry may control the micromirror elements such that, for a desired tuning wavelength, effective transverse blaze grating element displacements of adjacent elements are equal to integral multiples, modulo half of the desired tuning wavelength, of a constant.

DETAILED DESCRIPTION

Figure 1:
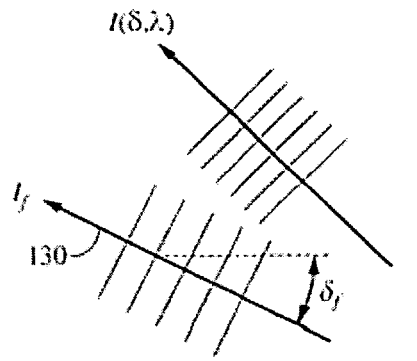
FIG. 1 is a schematic illustration of a conventional static blazed grating.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

Overview

The embodiments of the invention described below relate to a method for tuning the output frequency of a laser by introducing a frequency-sensitive reflective grating in place of one of the laser cavity mirrors. The frequency sensitive grating is a deformable phased array (PA) of mirrors that is functionally approximately equivalent to a blazed grating with controllable rotation and translation. In the deformable PA, however, the macroscopic rotation and translation are replaced by microscopic motions of the micromirrors (on the order of a wavelength). Such a grating has controllable diffraction angles for different wavelengths of incident light. In particular, along fixed incident and reflected angles the device functions as a narrow-band wavelength filter with finesse equal to the number of illuminated grating periods.

The type of grating described in these embodiments makes it possible to create a tunable external-cavity laser (ECL), in which microscopic motion of the phased-array elements allow the laser to (a) tune across the entire linewidth of the laser gain medium (most likely a laser diode, i.e. tens of nm linewidth); (b) achieve single mode operation; and (c) tune continuously with no mode hopping. The fact that the laser can be tuned through microscopic motion of the grating elements increases the tuning speed of the laser and removes the need for complex and expensive machinery to support macroscopic motion of the grating. These lasers are thus faster and less expensive than traditional external cavity tunable semiconductor lasers. One specific embodiment of the invention allows external cavities to be self-aligned, which has the potential to significantly reduce packaging complexity and cost.

Although the present inventors developed these gratings initially to serve as components in tunable lasers, the gratings have obvious uses in other optical applications as well. For example, these tunable blazed gratings can be used in high-resolution correlation spectroscopy. Synthetic spectra can be generated using these gratings to provide the basis for a versatile spectrometer that can be instantly reconfigured. Moreover, because these tunable blazed gratings operate in a higher diffraction order than conventional gratings, they provide high dispersion, which can enable high-resolution measurements (the free spectral range is reduced proportionately). An alternative method of generating synthetic spectra with even higher resolution is to periodically sweep a tunable laser across a range of wavelengths and modulate it at appropriate times as to produce a time-averaged synthetic spectrum. Another application of these tunable blazed gratings is as high-resolution wavelength filters for wavelength division multiplexing.

Static Blazed Gratings

A conventional static blazed grating 100 is shown in FIG. 1. A plane wave 120 with intensity $I_0$ and wavelength $\lambda$ is incident on the grating at a small angle $\delta_i$ from the blaze edge normal. A reflected wave 130 with intensity $I_f$ reflects from the grating at a small angle $\delta_f$ from the blaze edge normal. More generally, the intensity I reflected from the grating at an angle $\delta$ relative to the incident wave is given to a good approximation (assuming $\Delta\lambda<<\lambda$) by:

$$I(\lambda, \delta) = I_0 \mathrm{diric}^2\left[\frac{2\pi}{\lambda_n}(\delta d_\perp - \Delta\lambda n), N\right]\mathrm{sinc}^2\left[\frac{\delta d_\perp}{\lambda_n}\right] \quad (1a)$$

This reflected wave has a relative phase shift (relative to a pure reflection from a mirror located at the first grating element) of $$\Delta\phi = \frac{2\pi}{\lambda}Nd_\parallel \quad (1b)$$

In the above two equations, $d_\perp$ and $d_\parallel$ are the blaze edge dimensions, as shown in FIG. 1; $\delta=\delta_i+\delta_f$ is the generalized angle between incident and reflected waves; n is the diffracted order that is exactly normal to the blaze edge if incident light is at wavelength $$\lambda_n = \frac{2d_\parallel}{n};$$

$\Delta\lambda=\lambda-\lambda_n$; and N is the number of illumined periods in the grating. The functions diric and sin c are defined by:

$$\mathrm{diric}(x, N) = \frac{\sin(Nx/2)}{N\sin(x/2)},$$

$$\mathrm{sinc}(x) = \frac{\sin(\pi x)}{\pi x}.$$

Figure 2:
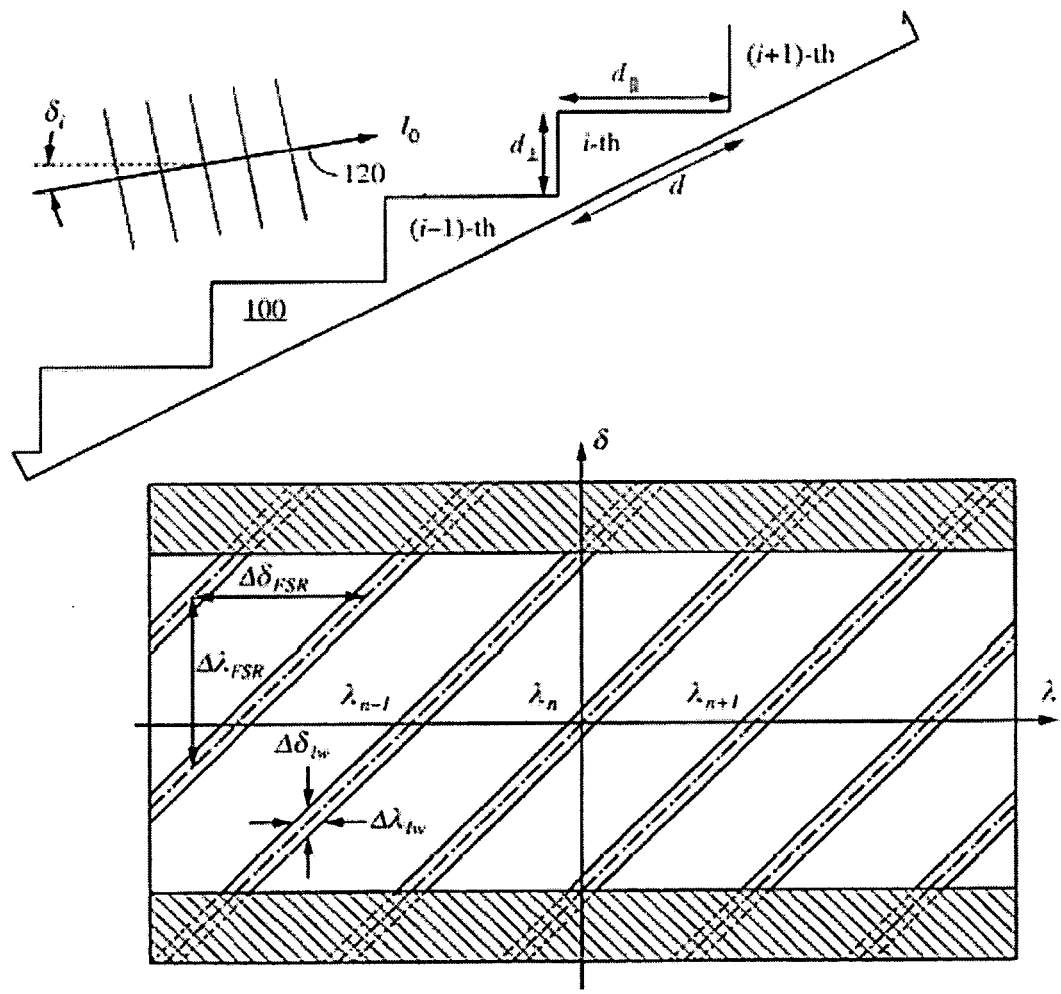
FIG. 2. is a graph of reflected intensity as a function of wavelength and generalized angle for the blazed grating of FIG. 1.

FIG. 2 shows a graph of the reflected intensity $I(\lambda,\delta)$ centered at the point $\lambda=\lambda_n$ and $\delta=0$. The shaded upper and lower horizontal bands of the graph represent angular regions into which no orders diffract significantly. The diric function represents the diffracted orders defined by the periodicity of the grating. The sinc function filters out all diffracted orders that lie sufficiently far from $\delta=0$, and this effect is due entirely to the shape of each grating period. The result is that for incident light at $\lambda_n$ virtually all incident power is diffracted along the $\delta=0$ direction, and in this direction all frequencies within one free spectral range ($\Delta\lambda_{FSR}$) about $\lambda_n$ are filtered out, i.e., the grating acts as a narrowband filter.

Several important quantities shown in FIG. 2 are given through equation (1a) and are summarized below, using several equivalent expressions for each:

$$\Delta\lambda_{FSR} = \frac{\lambda_n}{n} = \frac{\lambda_n^2}{d_\parallel} \quad (2a)$$

$$\Delta\delta_{FSR} = \frac{2}{n}\tan\theta = \frac{\lambda_n}{d_\perp} \quad (2b)$$

$$\Delta\lambda_{lw} = \frac{\Delta\lambda_{FSR}}{N} = \frac{\lambda_n}{nN} = \frac{\lambda_n^2}{2Nd_\parallel} \quad (2c)$$

$$\Delta\delta_{lw} = \sqrt{\Delta\delta_i^2 + \Delta\delta_f^2} = \frac{2}{Nn}\tan\theta = \frac{\lambda_n}{Nd_\perp} \quad (2d)$$

$$\mathrm{slope} = \frac{\Delta\lambda_{lw}}{\Delta\delta_{lw}} = \frac{\Delta\lambda_{FSR}}{\Delta\delta_{FSR}} = \frac{\lambda_n}{2\tan\theta} = \frac{\lambda_n d_\perp}{2d_\parallel} = \frac{d_\perp}{n} \quad (2e)$$

$$\lambda_n = \frac{2d_\parallel}{n} \quad (2f)$$

The linewidth variables (indicated by lw subscripts) are defined as half the distance between the first zero crossings of the corresponding line shapes (which are essentially sinc functions for uniform illumination of the grating).

In general, the illumination of the grating will not be uniform, but will most likely be a Gaussian. Uniform illumination over a finite area is equivalent to some angular continuous superposition of ideal plane waves (illuminating an infinite grating $N\to\infty$) with angular spread given by $$\Delta\delta_i = \frac{\Delta\delta_{lw}}{\sqrt{2}}$$

with $\Delta\delta_{lw}$ given by (2d), and thus leading to a linewidth given by (2c). Gaussian illumination can be similarly broken up into plane waves (each one illuminating the grating uniformly, so that the above formulas still apply as $N\to\infty$), but now the angular spread is $$\Delta\delta_i = \frac{\lambda}{\pi\omega_0} = \frac{\lambda}{(\pi/2)Nd_\perp} \quad (3)$$

where we have assumed that the beam illuminates N grating elements within its beam waist diameter $2\omega_0$. Knowing this angular spread, and assuming $\Delta\delta_i=\Delta\delta_f=\Delta\delta/\sqrt{2}$, the linewidth is then given by the slope in (2e):

$$\frac{\Delta\lambda_{lw}}{\lambda_n} = \frac{d_\perp}{n\lambda_n}\Delta\delta_{lw} = \frac{2\sqrt{2}}{\pi}\frac{1}{Nn} \quad (4)$$

Everything else in (2) holds as stated for non-uniform illumination.

Variable Blazed Gratings and Deformable Phased Arrays

Figure 3A:
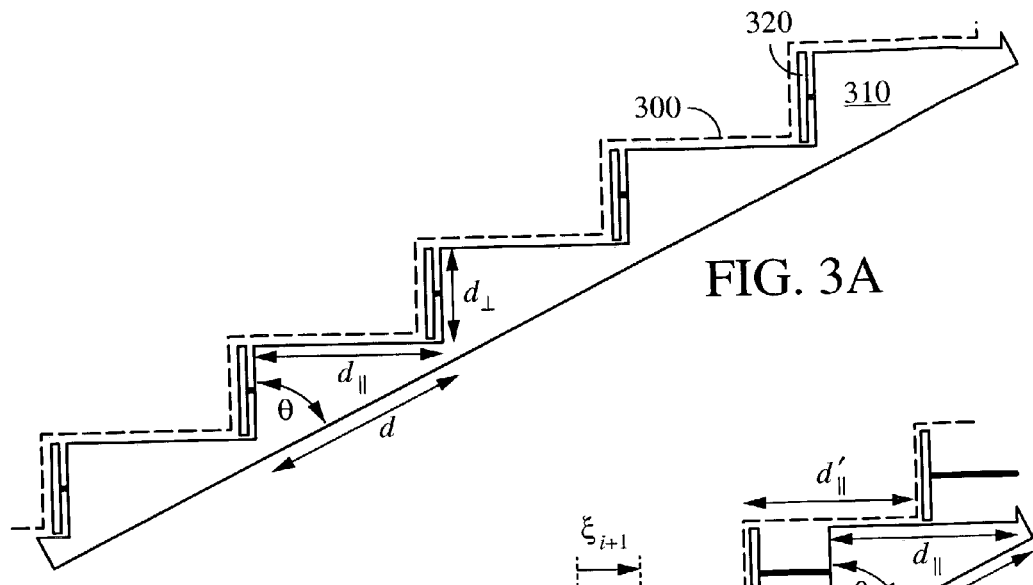
FIGS. 3A–C illustrate a tunable blazed grating in three configurations, according to the present invention.
Figure 3B:
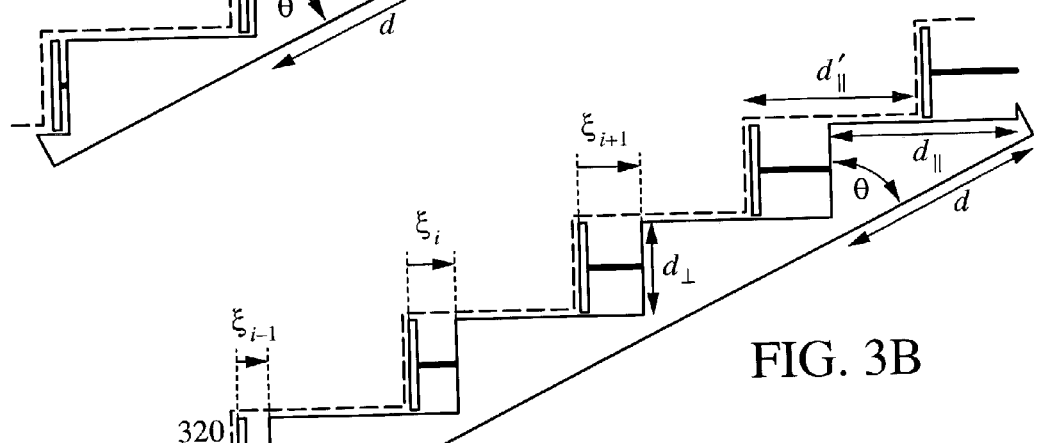

In a static blazed grating the blaze edge dimensions $d_\perp$ and $d_\parallel$ are fixed. A variable blazed grating allows one or both of these dimensions to be altered, thereby changing fundamental optical properties of the grating. FIGS. 3A and 3B illustrate how a phased array grating with mechanical motion on the order of wavelengths can approximate the action of a variable blazed grating, thus acting as a tunable filter. Shown in FIG. 3A is a static blazed grating 300 identical to the grating 100 of FIG. 1 together with an equivalent phased micromirror array 310. Positioned on each transverse blaze edge is a movable micromirror 320. Each micromirror can be independently controlled to alter its transverse displacement from equilibrium by a distance $\xi_i$. All the micromirrors in FIG. 3A have a common displacement $\xi$, so that the difference between successive grating period element displacements is zero, i.e., $\Delta\xi=0$. Consequently, the micromirror array 310 has the same effective transverse blaze edge dimension $d_\|$ as the static blazed array 300. As shown in FIG. 3B, however, the same micromirror array 310 with different micromirror displacements is an equivalent of a different static blazed array 330. In particular, the micromirrors 320 are controlled to have different displacements $\xi_i$ resulting in a constant value of $\Delta\xi$. Consequently, the effective transverse blaze edge dimension of the array is changed to $d_\|'=d_\|+\Delta\xi$. More generally, the effective transverse blaze edge dimension $d_{\|,i}$ for the $i^{th}$ grating period element can be arbitrarily and individually controlled so that $$d_{\|,i}=d_\|+(\xi_i-\xi_{i-1})$$

To tune the array away from $\lambda_n$ by $\Delta\lambda$, then according to (2f) we require $$\Delta\lambda = \frac{2(\xi_i - \xi_{i-1})}{n} \qquad (5)$$

or $\Delta\xi_i = n\Delta\lambda/2$. This implies that the displacement of each successive micromirror element increases by $n\Delta\lambda/2$. Specifically, the $i^{th}$ mirror will have a displacement of $$\xi_i = \frac{\Delta\lambda n_i}{2} \qquad (6)$$

Thus, for sufficiently large i the displacement will exceed the maximum mirror displacement $\xi_{max}$ of the micromirror array elements. On the face of it, this might seem to severely limit the tuning range of the array. However, this problem can be overcome by recognizing that it is sufficient to adjust the mirror displacements to a given value modulo half a wavelength. In other words, the displacements can be set to $$\xi_i = \frac{n\Delta\lambda}{2}i \quad \mathrm{mod}\frac{\lambda_n}{2} \qquad (7)$$

Figure 3C:
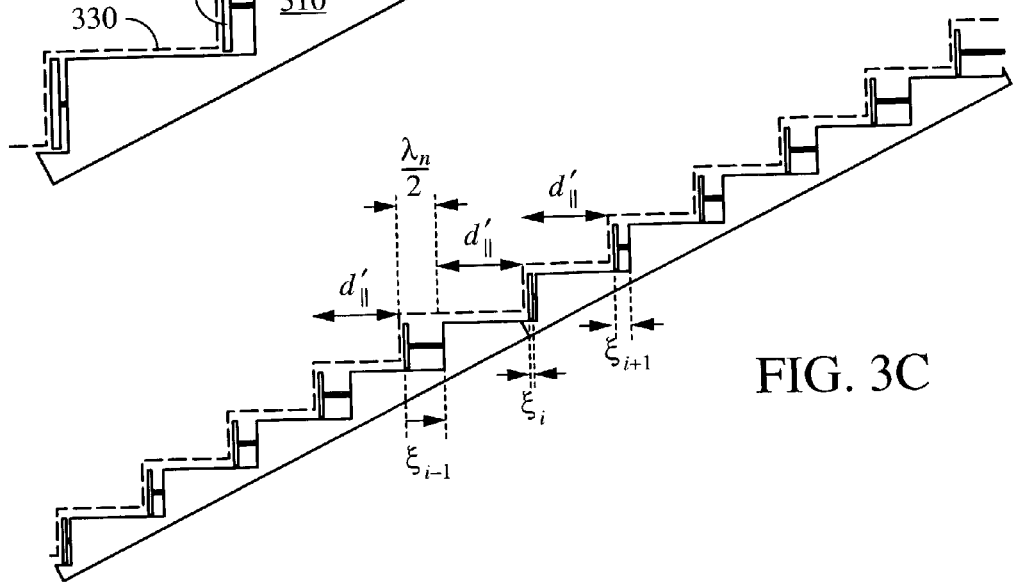

The maximum displacement $\xi_{max}$ of micromirror elements in the array is thus required to be only half a wavelength. FIG. 3C illustrates how the displacement values increase in successive elements up to $\xi_{i-1}$, jump down at $\xi_i$, and continue at $\xi_{i+1}$ to increase.

Although the effective blazed grating corresponding to this configuration of the array will have occasional $\lambda_n/2$ jumps, the array still effectively acts as a blazed grating provided the tuning shift is small compared to the wavelength, i.e., when $$\Delta\lambda<<\lambda \qquad (8)$$

In this case, equations (2a–f) still describe the grating operation correctly to a good approximation (using the shifted $d_\|'$ value in place of $d_\|$). The actual grating described by (7) is equivalent to the ideal grating described by (6) combined with a difference grating that behaves like a flat mirror at wavelengths near $\lambda_n$.

Therefore, the phased array blazed grating acts as a tunable filter with characteristics given by equations (2), and tuning sensitivity given by equation (7). The array can also be controlled to perform other optical functions. For example, by superimposing a parabolic shift in all $\xi_i$, the array emulates a curved cylindrical mirror superimposed over the tunable filter. As those skilled in the art will appreciate, other variations of the values of $\xi_i$ than (7) will lead to a whole family of possible filter responses and beam shapes that can be customized to various applications as appropriate.

EMBODIMENT I

Blazed Arrays with V-Mirrors

Figure 4A:
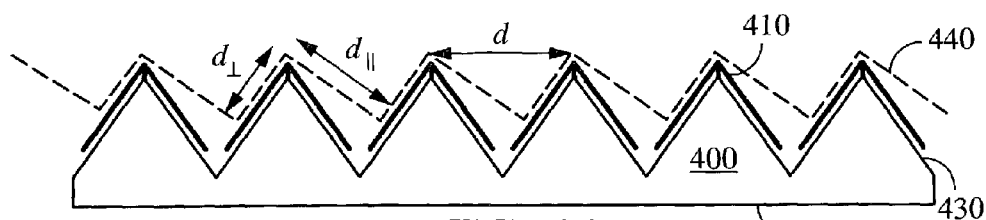
FIGS. 4A–D illustrate two versions of a first embodiment of a tunable phased array of the present invention, each in two configurations.
Figure 4B:
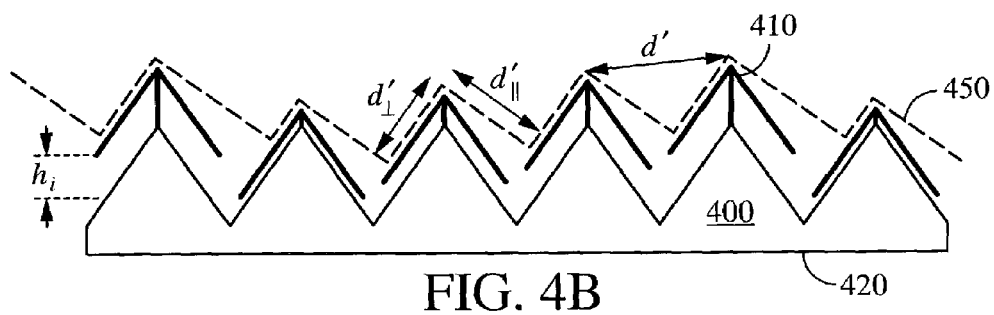

An embodiment of the device described above is shown in FIGS. 4A and 4B. The array is preferably realized as a micro-electro-mechanical system. A silicon substrate 400 has a flat lower surface 420 and a saw-tooth shaped upper surface 430 created, for example, using conventional KOH etching techniques on a (100) silicon substrate. Fabricated on the upper saw-tooth surface 430 are inverted V-shaped aluminum-coated polysilicon micromirrors 410 that cap each saw-tooth peak and polysilicon electrodes (not shown) for controlling the vertical movement of individual micromirrors. The mirrors may be built using well-established flat mirror techniques by depositing a sacrificial layer of oxide over the electrodes before depositing the mirror layers, and then removing the oxide. Each V-shaped micromirror element has two tilted mirror surfaces joined at their edges. The mirrors preferably are very smooth, and have a roughness less than a tenth of the wavelength of light being reflected. FIG. 4A shows the device with all the mirrors having a common displacement, resulting in an equivalent blazed grating 440 indicated by the dotted lines. As shown in FIG. 4B, each element's two V-shaped mirrors can be moved together in the vertical direction (e.g., by a distance $h_i$, as shown), resulting in an equivalent transverse blaze displacement of $$\xi_i=-h_i\cos(54°) \qquad (9)$$

where $h_i$ is the vertical displacement of the $i^{th}$ mirror (positive up). This movement can be provided, for example, by electrostatic actuation using comb drives. As a result of the different mirror displacements, the array is tuned to be equivalent to a different blazed grating 450 indicated by the dotted lines. Thus, by appropriately altering the micromirror displacements, the array functions as a tunable blazed grating. The control of the micromirrors may be performed by a control circuit integrated on the same chip as the array, or on a separate integrated circuit connected to the array. The mirror size is different on different versions of the device. In one version, the mirrors are approximately 150 µm by 200 µm. Those skilled in the art can appropriately select specific values for particular purposes.

Figure 4C:
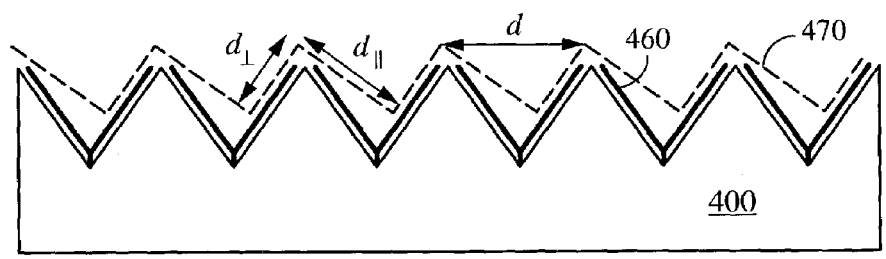
Figure 4D:
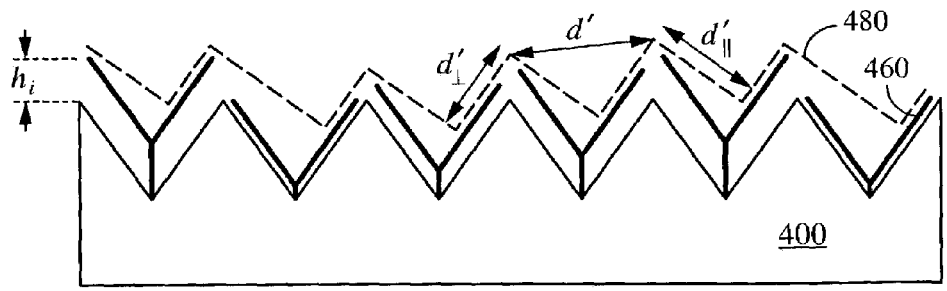

An alternative realization of this embodiment is shown in FIGS. 4C and 4D. This alternative is identical in all respects to the device shown in FIGS. 4A and 4B except that V-shaped pair of tilted mirrors 460 are placed in the saw-tooth valleys in an upright V orientation. There may also be slight differences in the electrodes used to move the mirrors. In both variations the two mirrors forming the V-shaped mirror of each element are both tilted at angles with respect to the bottom substrate surface defining the plane of the array as a whole. The angular tilt of the mirrors does not change. Only their position changes as they move vertically up and down. FIG. 4C shows the mirrors 460 with a common displacement, functioning as a first blazed grating 470. FIG. 4D shows the mirrors 460 with different displacements (e.g., displacement $h_i$), functioning as a second blazed grating 480. The array can thus be controlled to function as different blazed gratings. In both variations of this embodiment there are some slight shadowing effects, but these effects are negligible as long as the motion of the mirrors is small compared to their size. It will also be noted that in both variations of this embodiment each of the two mirrors forming each V-shaped element is both a tilted and a movable mirror.

EMBODIMENT II

Corner-Cube Phased Array (CCPA)

Figure 5A:
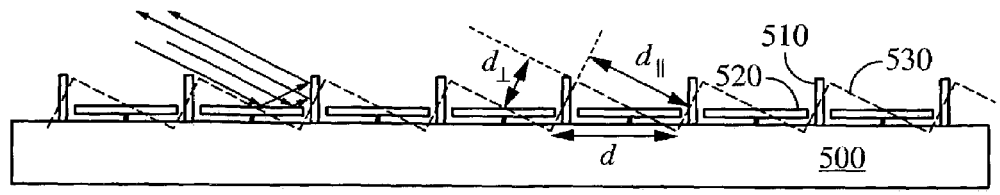
FIGS. 5A–B illustrate a second embodiment of a tunable phased array of the present invention in two configurations.
Figure 5B:
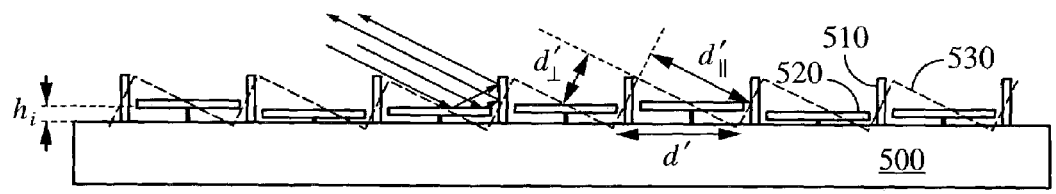

Another embodiment of the device is a phased array of micromirror elements that have corner-cube-like structures, as shown in FIGS. 5A and 5B. The array has a substrate 500 with micromirrors fabricated on its top surface, which is flat. Each element of the array has a corner-cube-like structure defined by a fixed tilted mirror 510 and a movable mirror 520. In one embodiment the tilted mirror is vertical and the movable mirror is horizontal. The mobile horizontal mirrors may be fabricated, for example, using the multi-user MEMS process (MUMPS). The vertical mirrors may be KOH etched anisotropically in nitride-patterned (110)-silicon and then bonded on top of the existing horizontal phased array. Alternatively, they may be fabricated horizontally and folded out into vertical position. The vertical mirrors 510 acting together with the horizontal mirrors create a corner-cube-like reflection of incident light. With all the movable mirrors controlled to have a common displacement, as shown in FIG. 5A, the array effectively functions as a first blazed grating 530. With the movable mirrors controlled to have different displacements (e.g., displacement $h_i$), as shown in FIG. 5B, the array effectively functions as a second blazed grating 540. Thus, by appropriately controlling the vertical displacements of mirrors 520, the array functions as a tunable blazed grating.

The corner-cube-like reflection of incident light has special optical properties. First, regardless of the angle of incidence, the path lengths of parallel light rays reflecting from the same element are all equal, so that the reflection is equivalent to bouncing off a normal surface. In addition, the rays are inverted in space when reflecting from the same element. This effect will not be strong, however, if the incident intensity does not vary appreciably across a single grating period. A third effect is that the sign of the reflected angle is reversed, so that now we have to define $\delta=\delta_i-\delta_f$ instead of a sum. Equations (2) still hold, but due to this effect we have the added bonus that the $\delta=0$ condition (i.e., peak intensity at $\delta_n$) corresponds to $\delta_f=\delta_i$, which means that at matched wavelength, the peak intensity of the reflected beam will be in the same direction as the peak intensity of the incident beam, so that embodiment II is much less sensitive to misalignment than embodiment I. In addition, this embodiment enjoys another advantage shared by other embodiments: it effectively forces all the power into a high order diffraction mode, which gets more dispersive as the angle of incidence becomes larger. This leads to higher resolution.

A simple analysis shows that an analogous equation to (9) holds in this case as well:

$$\xi_i = -h_i \cos\theta \qquad (10)$$

where $\theta$ is the equivalent blaze angle as defined in FIG. 1, or equivalently the angle of incidence of the $n^{th}$ diffraction order. Note that the angle of incidence in embodiment I is fixed at 54° (in the case of silicon), while in embodiment II it can be varied, depending on the fabricated vertical wall height h:

$$\tan\theta = \frac{2h}{d} \qquad (11)$$

This additional design flexibility is an advantage of embodiment II.

In a variation of this embodiment, the movable mirrors are constructed with a small fixed tilt away from the horizontal. This tilt is designed to compensate for departures from the perfect verticality of the vertical mirrors due to effects of the KOH etching process. If the vertical mirrors are depart slightly from vertical, the movable mirrors can be fabricated with a compensatory tilt off from the horizontal to achieve perfect orthogonality. This orthogonality is important because a deviation by a slight angle $\beta$ from 90 degrees between the vertical and horizontal mirrors will split the reflection of the corner cube into two beams diverging at an angle $4\beta$. Preferably, the horizontal and vertical mirrors are orthogonal to within 0.1 degrees. Thus, in this embodiment, each element of the array has a movable mirror that is parallel or nearly parallel to the substrate surface and a tilted mirror that is tilted orthogonally or nearly orthogonally to the substrate surface. Each element may have additional such orthogonal mirrors.

In another variation of this embodiment, additional vertical walls are added to provide a true three-dimensional corner-cube structure for each array element. Each two-walled corner-cube-like strip is replaced by a series of three-walled corner-cubes. This provides tolerance to optical misalignments in two directions rather than just one. The one-dimensional array of micromirror strips may be replaced by a two-dimensional phased array of square micromirrors, adding the flexibility of independently varying the phase of each individual corner cube in the two-dimensional array. Such a design will have a significantly richer set of attainable transfer functions, which now would depend on two angles instead of one (as well as the wavelength). Thus, more efficient optical filters can be produced. In addition to filtering characteristics, the two-dimensional phased array can be chirped in two dimensions, thus emulating a spherical mirror instead of a cylindrical one mentioned above.

In another variation of this embodiment, additional functionality is attained by controlling the tilt of the mirrors away from horizontal in addition to controlling their vertical movement. In other words, deliberate controlled departures from orthogonality between the mirrors in each corner-cube element can achieve new functionality. For example, a beam that ordinarily retraces its path of incidence upon reflection can be split into two diverging beams that radiate out of the system, thus effectively turning the beam off without regard to its wavelength. Mirrors with such controllable tilt can be fabricated by providing, at each side of the mirror, an electrode above the mirror and another below the mirror. Each side of the mirror can then be independently lifted up or pushed down, providing two flat states (both sides up or both sides down) and two tilted states (one side up and the other side down).

EMBODIMENT III

Phased Arrays with Tilted, Movable Mirrors

Figure 6A:
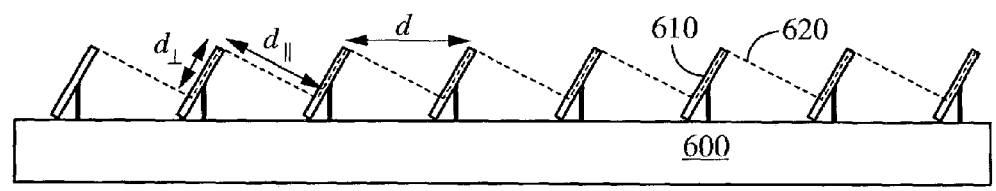
FIGS. 6A–B illustrate a third embodiment of a tunable phased array of the present invention in two configurations.
Figure 6B:
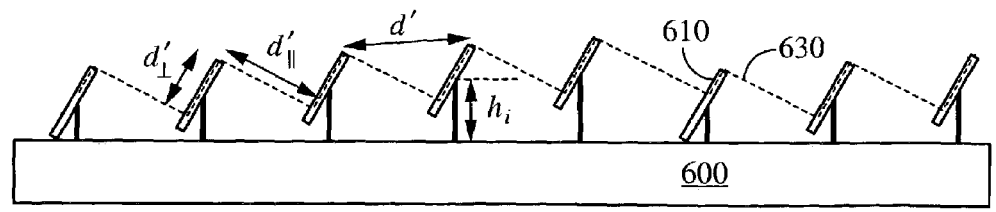

A third embodiment of a phased array grating is shown in FIGS. 6A and 6B. On a flat substrate 600 an array of tilted micromirrors 610 are fabricated together with electrodes for individually controlling their vertical displacements. The mirrors may be built just as the tilted micromirrors in embodiment II, except with a much larger tilt angle. The array in this embodiment, however, does not have vertical walls. Each element of the array has a single micromirror whose orientation relative to the substrate plane is fixed at a non-zero angle. Although their tilt angle is fixed, the mirrors can be moved vertically. Each of these mirrors in an element of the array simultaneously serves as both a tilted mirror and a movable mirror. FIG. 6A shows the device with all the mirrors having a common displacement, resulting in an equivalent blazed grating 620. As shown in FIG. 6B, the mirrors can be electrostatically moved individually in the vertical direction (e.g., by a distance $h_i$, as shown), to tune the array to function as a different blazed grating 630. Thus, by appropriately altering the micromirror displacements, the array functions as a tunable blazed grating.

Tunable Laser Using Phased Array Gratings

Figure 7A:
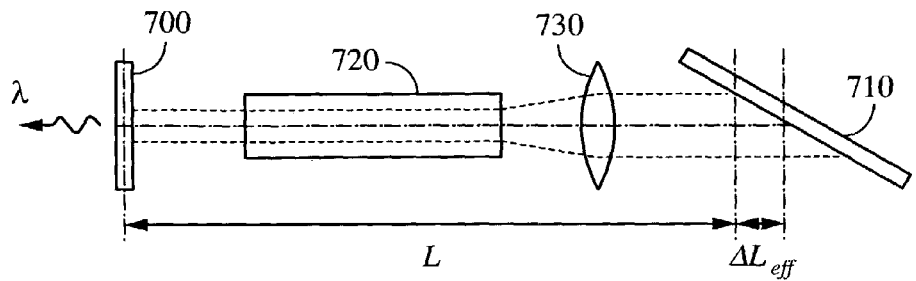
FIGS. 7A–B are schematic diagrams illustrating two variations of a tunable laser according to one embodiment of the present invention.
Figure 7B:
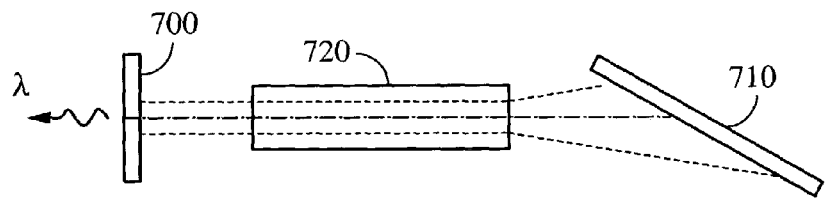

Although the phased array gratings discussed above turn out to be useful in various optical applications, they serve as the key component of an improved tunable laser. One possible configuration for a tunable laser according to the present invention is shown in FIG. 7. The laser includes an output coupler 700 and phased array grating 710 which are the two mirrors defining the resonant optical cavity of the laser. The grating causes a relative phase shift (1b), which is equivalent to a mirror at a distance of $$\Delta L_{\mathit{eff}} = \frac{Nd_{\parallel}}{2} \tag{12}$$

The array 710 is preferably fixed in place and does not translate or rotate as a whole. Only its micromirror elements move. The length L is the optical distance from the output coupler 700 to the first element of the grating 710, and $L_{\mathit{eff}} = L + \Delta L_{\mathit{eff}}$ is the effective length that governs the mode spacing in (13). Inside the cavity is a gain medium 720 and a lens 730. In an alternate embodiment, the lens is eliminated and the phases of the phased array are chirped to emulate a curved mirror to a good degree of approximation.

The transverse mode and cavity geometry effects will now be discussed to illustrate the principles governing the operation of the laser. We assume a $0^{th}$ order Gaussian mode operation, so that the beam reflected off the grating is symmetrical to the incident beam and $\Delta\delta_i = \Delta\delta_f = \Delta\delta/\sqrt{2}$. (In practice, this is achieved automatically by a waveguide structure in the gain medium.) Therefore, the filter has a linewidth given by (4). It is normally considered desirable to have as narrow a linewidth as possible. Thus, it is preferable to operate with small (nearly grazing) incidence at the grating, maximizing n, and to operate with a large radius of the (collimated) beam hitting the grating, maximizing N. It should be noted, however, that incident angle is fixed in embodiment I. In the case of embodiment II, according to (10) the motion of the mirrors may have to be large for grazing incidence, which can conflict with the assumption of small motion of mirrors as compared to their size. Those skilled in the art can balance these trade-offs in light of particular design and manufacturing requirements.

The beam preferably has a planar phase incident on the grating in order for (3) to hold, which is ensured by the collimating lens directly in front of the grating. It is also possible to superimpose a chirp on the grating elements which would make them function approximately as a curved mirror in addition to a filter. In this case instead of (7) we would have $$\xi_i = \frac{n\Delta\lambda}{2}i - \frac{\left(\frac{1}{2}N - i\right)^2}{2R} \mod \frac{\lambda_n}{2} \tag{13}$$

where R is the curvature of the equivalent mirror.

Figure 8:
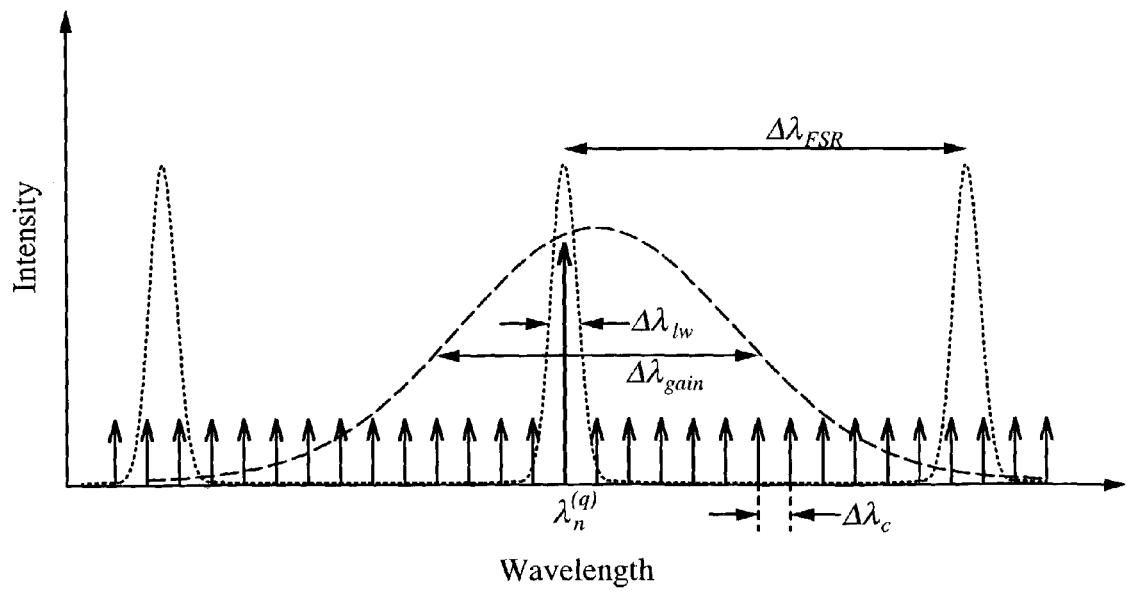
FIG. 8 is a graph illustrating wavelength tuning characteristics related to the operation of the laser of FIGS. 7A–B.

Preferably the cavity diffraction is compensated for and the wavelength modes, to good approximation, all have the same diffraction. As illustrated by the graph in FIG. 8, the classical laser cavity can support a discrete set of wavelengths given by $\lambda^{(q)} = 2L/q$, where q is an integer. Within a small neighborhood of $\lambda_n$, wavelength mode spacing is given by $$\Delta\lambda_c = \frac{\lambda_n^2}{2L_{\mathit{eff}}} \tag{14}$$

Those modes that fall within a certain linewidth $\Delta\lambda_{\mathit{gain}}$ of the gain medium see enough amplification to oscillate spontaneously. For an inhomogeneously broadened linewidth, virtually all the modes that can oscillate will do so. By introducing the grating 710 as one of the cavity mirrors, we impose on the plane waves in the cavity a one-pass filter that has the form of equation (1). The resulting filtering characteristics in $\lambda$ take the general form shown in FIG. 8. Through the appropriate use of the phased array grating, this laser is able to (a) tune across the entire gain linewidth with single mode oscillation, and (b) tune continuously, i.e. with no mode hopping.

Property (a) implies that only one peak of the filter falls into the gain linewidth at a time, i.e., $$\Delta\lambda_{\mathit{gain}} < \Delta\lambda_{\mathit{FSR}} = \frac{\lambda_n}{n} \tag{15}$$

It is also desirable to maximize n, and thus the ideal choice is for the free spectral range to equal the linewidth of the gain. Property (a) also implies that adjacent modes do not oscillate together. Thus, at the very least, the linewidth of the filter preferably is not orders of magnitude larger than the mode spacing. After comparing (14) and (2c), this leads to:

$$L \text{ is not orders of magnitude greater than } Nd_{\parallel} \tag{16}$$

In other words, the cavity length is preferably not orders of magnitude larger than the grating size.

Property (b) concerns continuous tuning. If the filter peak wavelength is tuned while the cavity modes remain fixed or shift in other ways, the laser output will hop from one cavity mode to the next, thus resulting in jumps in power, or discontinuous tuning. The present laser system solves this mode hopping problem by shifting the cavity modes in synchrony with the filter peaks, so that the grating is always filtering the same resonant mode of the cavity on the same grating diffraction order, i.e., tuning while also maintaining $\lambda^{(q)} = \lambda_n$. In order to make $\lambda^{(q)} = \lambda_n$ all the time, we can see from (14) and (2f) that instead of (7), the correct expression for grating state should be $$\xi_i = (L_{\textit{eff}} + id_\parallel)\frac{\Delta\lambda}{\lambda_n^{(q)}} \mod \frac{\lambda_n^{(q)}}{2} \qquad (17)$$

By controlling the phased array grating to have these displacements, continuous single-mode tuning across the entire gain region is achieved. A chirp as in (13) could also clearly be superimposed on (17).

Figure 9:
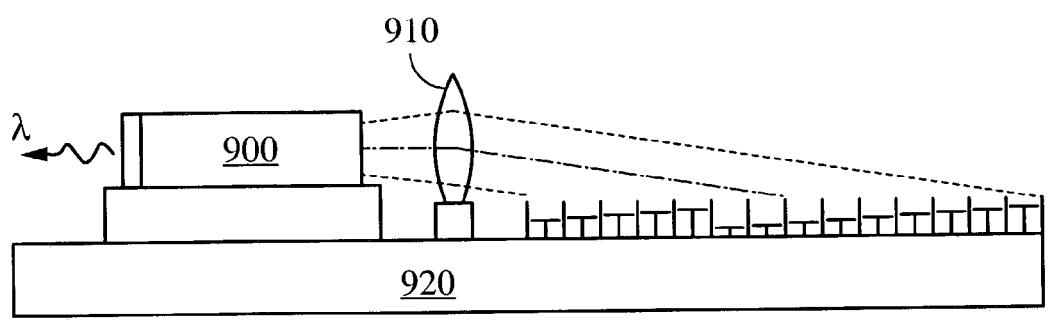
FIG. 9 illustrates an embodiment of a tunable laser according to the present invention.

A tunable laser according to the present invention can be realized in various ways. According to one embodiment, shown in FIG. 9, an appropriately coated laser diode 900 and a bulk lens 910 are positioned on a silicon substrate 920 upon which a phased array grating 930 was fabricated. The advantage of this particular system is that the hardest component to fabricate—the phased array—is flat on the wafer. This eliminates the problem of having to rotate this component to align it to the cavity. The lens serves the function of a prism to redirect the beam onto the grating, as well as for collimation. An alternative similar design would be to eliminate the lens and chirp the grating as described by (13). This would also clearly require tilting the laser diode to align it with the phased array. The laser device can be less than a square centimeter in area, which would allow practical fabrication of one-dimensional arrays of tunable lasers.

Those skilled in the art of external cavity tunable lasers and phased micromirror arrays will recognize that the specific embodiments described in detail above have many obvious variations and adaptations. For example, it is well known that there are many different cavity configurations possible for external tunable cavity lasers. In addition to the Littrow cavity configuration shown in FIG. 7, other variations on the Littrow-type configuration are possible, as well as other configurations including, but not limited to, various Littman cavity configurations. Thus, the cavity may include additional mirrors, lenses, and other optical elements. It should also be noted that the tunable blazed grating, rather than a standard mirror, can be used to couple the laser light out of the cavity. In particular, while the grating reflects one diffraction order back into the cavity, it also couples out of the cavity another diffraction order.

The invention claimed is:

1. A laser comprising multiple reflectors defining a resonant cavity, and an optical gain medium positioned within the resonant cavity, wherein one of the reflectors is a programmable micromirror array, wherein;

(1) the array has a fixed distance and orientation relative to the other reflectors and acts as a tunable blazed diffraction grating providing continuous tuning of a single resonant mode over a wavelength gain region of the gain medium; and (2) the array comprises a plurality of micromirrors, wherein each micromirror element has a tilted mirror and a movable mirror, wherein the tilted mirror has a reflective surface orientation fixed at a non-zero angle with respect to the substrate surface, wherein the movable mirror has a reflective surface position movable in a direction perpendicular to the substrate surface in response to an electrical control signal.

2. The laser of claim 1 wherein the tilted mirror and the movable mirror are oriented substantially orthogonally relative to each other.

3. A programmable micromirror array comprising a plurality of micromirror elements periodically positioned on a substrate surface, wherein each micromirror element has a tilted mirror and a movable mirror, wherein the tilted mirror has a reflective surface orientation fixed at a non-zero angle with respect to the substrate surface, wherein the movable mirror has a reflective surface position movable in a direction perpendicular to the substrate surface in response to an electrical control signal.

4. The array of claim 3 wherein the tilted mirror is fixed with respect to the substrate surface.

5. The array of claim 4 wherein the movable mirror is oriented parallel to the substrate surface.

6. The array of claim 4 wherein the orientation of the tilted mirror is orthogonal to the orientation of the movable mirror.

7. The array of claim 3 wherein the array further comprises circuitry to control the array to act as a tunable blazed diffraction grating, wherein the circuitry controls micromirror elements such that, for a desired tuning wavelength, effective transverse blaze grating element displacements of adjacent elements are equal, modulo half of the desired tuning wavelength, to integral multiples of a constant.

* * * * *